(12) United States Patent
Ng

(10) Patent No.: US 7,952,109 B2
(45) Date of Patent: May 31, 2011

(54) LIGHT-EMITTING CRYSTAL STRUCTURES

(75) Inventor: Hock Min Ng, Westfield, NJ (US)

(73) Assignee: Alcatel-Lucent USA Inc., Murray Hill, NJ (US)

( * ) Notice: Subject to any disclaimer, the term of this patent is extended or adjusted under 35 U.S.C. 154(b) by 78 days.

(21) Appl. No.: 11/456,428

(22) Filed: Jul. 10, 2006

(65) Prior Publication Data

US 2008/0006831 A1    Jan. 10, 2008

(51) Int. Cl.
*H01L 33/00* (2010.01)
(52) U.S. Cl. ............... 257/94; 257/13; 257/95; 257/96; 257/97; 257/E33.006; 257/E33.007; 257/E33.025
(58) Field of Classification Search ............. 257/94, 257/95, 96, 97, E33.006–E33.007, 13, E33.025
See application file for complete search history.

(56) References Cited

U.S. PATENT DOCUMENTS

| | | |
|---|---|---|
| 4,987,377 A | 1/1991 | Gray et al. |
| 5,141,459 A | 8/1992 | Zimmerman |
| 5,218,771 A | 6/1993 | Redford |
| 5,334,908 A | 8/1994 | Zimmerman |
| 5,341,390 A | 8/1994 | Yamada et al. |
| 5,345,456 A | 9/1994 | Dai et al. |
| 5,359,256 A | 10/1994 | Gray |
| 5,363,021 A | 11/1994 | MacDonald |
| 5,396,361 A | 3/1995 | Sasaki et al. |
| 5,420,876 A | 5/1995 | Lussier et al. |
| 5,440,574 A | 8/1995 | Sobottke et al. |
| 5,449,435 A | 9/1995 | Ageno et al. |
| 5,450,429 A | 9/1995 | Klemer et al. |
| 5,479,431 A | 12/1995 | Sobottke et al. |
| 5,628,659 A | 5/1997 | Xie et al. |
| 5,793,791 A | 8/1998 | Lasser et al. |
| 5,814,156 A | 9/1998 | Elliott et al. |
| 5,861,707 A | 1/1999 | Kumar |
| 5,915,164 A | 6/1999 | Taskar et al. |
| 5,969,467 A | 10/1999 | Matsuno |
| 6,172,325 B1 | 1/2001 | Baird et al. |
| 6,218,771 B1 | 4/2001 | Berishev et al. |
| 6,448,100 B1 | 9/2002 | Schulte et al. |
| 6,649,939 B1 | 11/2003 | Wirth |
| 6,809,351 B2 | 10/2004 | Kuramoto et al. |
| 6,891,187 B2 | 5/2005 | Cho et al. |
| 6,924,500 B2 | 8/2005 | Okuyama et al. |
| 6,986,693 B2 | 1/2006 | Chowdhury et al. |

(Continued)

FOREIGN PATENT DOCUMENTS

EP    1467404    10/2004

(Continued)

OTHER PUBLICATIONS

Palacios, et al., Wet Etching of GaN Grown by Molecular Beam Epitaxy on Si(111), Semiconductor Science and Technology, IOP, Bristol, GB, vol. 15, No. 10, Oct. 1000, pp. 996-1000.

(Continued)

*Primary Examiner* — Kiesha R Bryant
*Assistant Examiner* — Minchul Yang
(74) *Attorney, Agent, or Firm* — Hitt Gaines, PC

(57) ABSTRACT

An apparatus comprising a structure comprising a group III-nitride and a junction between n-type and p-type group III-nitride therein, the structure having a pyramidal shape or a wedge shape.

20 Claims, 13 Drawing Sheets

U.S. PATENT DOCUMENTS

| | | | |
|---|---|---|---|
| 7,084,563 | B2 | 8/2006 | Chowdhury et al. |
| 7,468,578 | B2 | 12/2008 | Chowdhury et al. |
| 2002/0104999 | A1 | 8/2002 | Nakajima et al. |
| 2003/0138983 | A1 | 7/2003 | Biwa et al. |
| 2003/0168666 | A1 | 9/2003 | Okuyama et al. |
| 2004/0061074 | A1 | 4/2004 | Chowdhury et al. |
| 2004/0129929 | A1 | 7/2004 | Okuyama et al. |
| 2005/0045894 | A1* | 3/2005 | Okuyama et al. ............ 257/95 |
| 2005/0145865 | A1 | 7/2005 | Okuyama et al. |
| 2005/0179025 | A1* | 8/2005 | Okuyama et al. ............ 257/13 |
| 2005/0285132 | A1* | 12/2005 | Orita ............................. 257/99 |
| 2009/0139957 | A1 | 6/2009 | Chowdhury et al. |

FOREIGN PATENT DOCUMENTS

| | | |
|---|---|---|
| EP | 1467404 A2 | 10/2004 |
| JP | 8-51248 | 2/1996 |
| JP | 10233385 A | 9/1998 |
| JP | 2000149765 A | 5/2000 |
| JP | 2001148349 A | 5/2001 |
| WO | WO92/02031 | 2/1992 |
| WO | WO00/74107 | 12/2000 |
| WO | WO2004/025733 | 3/2004 |

OTHER PUBLICATIONS

Katayama, et al., "Buffer design for Nitrogen Polarity GaN on Sapphire (0001) by RF-MBE and application to the nanostructure formation using KOH etching", Physica E—Low-Dimensional Systems and Nanostructures, Elsevier Science BV, NO, vol. 32, No. 1-2, May 2006, pp. 245-248.

Arakawa, "Progress in GaN-Based Quantum Dots for Optoelectronics Applications", IEEE Journal of Selected Topics in Quantum Electronics, vol. 8, No. 4, Jul./Aug. 2002, pp. 823-832.

Weyher, et al., "Chemical Polishing of Bulk and Epitaxial GaN", Journal of Crystal Growth, vol. 182 (1997), pp. 17-22.

Kozawa, et al., "Field Emission Study of Gated GaN and Alg1G0.1, Ga0.9N/GaN Pyramidal Field Emitter Rays", Applied Physics Letters, vol. 75, No. 21, Nov. 22, 1999, pp. 3330-3332.

Sowers, et al., "Thin Films of Aluminum Nitride and Aluminum Gallium Nitride for Cold Cathode Applications," Applied Physics Letters, vol. 71, No. 16, Oct. 20, 1997, pp. 2289-2291.

Seelmann-Eggebert, et al., "Polarity of (00.1) GaN Epilayers Grown on a (00.1) Sapphire," Applied Physics Letters, vol. 71, No. 18, Nov. 3, 1997, pp. 2635-2637.

Mileham, et al., "Wet Chemical Etching of AlN," (American Institute of Physics), Appl. Phys. Lett. 67(8), Aug. 21, 1995, pp. 1119-1121, USA.

Huang, et al., "Dependence of GaN polarity on the parameters of the buffer layer grown by molecular beam epitaxy," (American Institute of Physics), Applied Physics Letters, vol. 78, No. 26, Jun. 25, 2001, pp. 4145-4147, New York, USA.

Visconti, et al., "Investigation of defects and surface polarity in GaN using hot wet etching together with microscopy and diffraction techniques," (Elsevier) Materials Science and Engineering, vol. B 93, 2002, pp. 229-233.

Ng, et al., "Patterning GaN Microstructures by Polarity-Selective Chemical Etching," (Japanese Society of Applied Physics), Japanese Journal of Applied Physics, vol. 42, Dec. 1, 2003, pp. L1405-L1407.

European Search Report dated Sep. 8, 2004 for EP Appl. No. 04250979.4-2203.

Eyres, et al., All-epitaxial fabrication of thick, orientation-patterned GaAs films for nonlinear optical frequency conversion, Applied Physics Letters, vol. 79, No. 7, Aug. 13, 2001, pp. 904-906.

Fejer, et al, Quasi-Phase-Matched Second Harmonic Generation: tuning and Tolerances, IEEE Journal of Quantum Electronics, vol. 28, No. 11, Nov. 1992, pp. 2631-2654.

Shutzmann, et al., "Playing with Polarity, Physica Status Solidi B-Basic Research," vol. 228, No. 2, Nov. 2001, pp. 501-512.

Curtis, "Efficiency Gains Boost High-Power LED Performance", Compound Semiconductor, Dec. 2005, pp. 27-30.

Srinivasan, et al., "Polychromatic Light Emission from Single InGaN Quantum Wells Grown on Pyramidal GaN Facets", Applied Physics Letters, vol. 87, 131911, 2005, pp. 131911-1 through 131911-3.

Fujii, "Increase in the Extraction Efficiency of GaN-Based Light-emitting Diodes Via Surface Roughening", Applied Physics Letters, vol. 84, No. 6, Feb. 9, 2004, pp. 855-857.

Ng, "GaN Nanotip Pyramids formed by Anisotropic Etching", Journal of Applied Physics, vol. 94, No. 1, Jul. 1, 2003, pp. 650-653.

Park, "Crystal Orientation Effects on Electronic Properties of Wurtzite IGaN/GaN Quantum Wells", Journal of Applied Physics, vol. 91, No. 12, Jun. 25, 2002, pp. 9904-9908.

Fu, D.J., et al.; "GaN Pyramids Prepared by Photo-Assisted Chemical Etching"; Journal of the Korean Physical Society, vol. 42, Feb. 2003; pp. S611-S613.

Kostopoulos, a., et al.; "Atomic force microscopy analysis of Ga-Face and N-face GaN grown on Al2O3 (0001) by plasma-assisted molecular beam epitaxy"; Advanced Semiconductor devices and Microsystems, 2000, 3rd International EuroConference, (Oct. 16, 2000), pp. 355-358.

* cited by examiner

LIGHT-EMITTING CRYSTAL STRUCTURES

The U.S. Government has a paid-up license in this invention and the right in limited circumstances to require the patent owner to license others on reasonable terms as provided for by the terms of DAAE 30-03-D-1013 awarded by the U.S. Army ARD (Picatinny Arsenal).

TECHNICAL FIELD OF THE INVENTION

The present invention relates to an apparatus having a light emitting diode comprising a structure having a Group III-nitride, and a method of making the apparatus.

BACKGROUND OF THE INVENTION

It is desirable to improve the efficiency of light-emitting crystal structures, such as light-emitting diodes (LEDs), because this would increase their scope of use in commercial applications. Efficiency can be improved in two ways: increase the external efficiency or increase the internal efficiency.

An improvement in external efficiency is achieved by extracting more light out of the structure. As well known by those skilled in the art light-emitting crystal structures have a critical angle where light reflected beyond that angle gets reflected internally and does not exit the structure. E.g., only about 5 percent of the light generated in conventional planar LED passes out of the LED, the rest being internally reflected. Efforts to extract more light include texturing planar LEDs to reduce the amount of internally reflected light.

SUMMARY OF THE INVENTION

One embodiment is an apparatus comprising a structure comprising a group III-nitride and a junction between n-type and p-type group III-nitride therein, the structure having a pyramidal shape or a wedge shape.

Another embodiment is an apparatus comprising a light-emitting crystalline structure on a substrate. The structure has n-type and p-type barrier regions and a junction there between. The junction is located at one or more surfaces of the n-type and the p-type barrier regions that are inclined relative to a planar surface of the substrate.

Another embodiment is a method manufacturing an apparatus. The method comprises forming a light-emitting crystalline structure that includes forming a first barrier region on a substrate, the first barrier region having one or more inclined surfaces relative to a planar surface of the substrate. Forming the structure also includes forming a second barrier region over the first barrier region, to form a junction at the inclined surfaces. The first barrier region comprises one of an n-type or p-type semiconductor crystal, and the second barrier region comprises the other of the n-type or p-type semiconductor crystal.

BRIEF DESCRIPTION OF THE DRAWINGS

The invention is best understood from the following detailed description, when read with the accompanying FIGURES. Various features may not be drawn to scale and may be arbitrarily increased or reduced in size for clarity of discussion. Reference is now made to the following descriptions taken in conjunction with the accompanying drawings, in which.

DETAILED DESCRIPTION

The present invention benefits from the recognition that both the intrinsic and extrinsic efficiency can be improved by forming light-emitting crystalline structures having an inclined surface. An improvement in internal efficiency can be achieved by altering the properties of the crystal material itself. Certain crystals, however, have no inversion symmetry along certain crystal axes, which causes the crystal to have an internal electric field. The internal electrical field detrimentally reduces the internal efficiency and can shift the wavelength of light emitted from such structures. Forming light emitting components of the structure on an inclined surface can render the structure a semi-polar or non-polar crystal, thereby decreasing or eliminating the internal electric field of the structure. Additionally, forming the structure on an inclined surface reduces the amount of light that gets internally reflected, thereby improving external efficiency.

Figure 1:
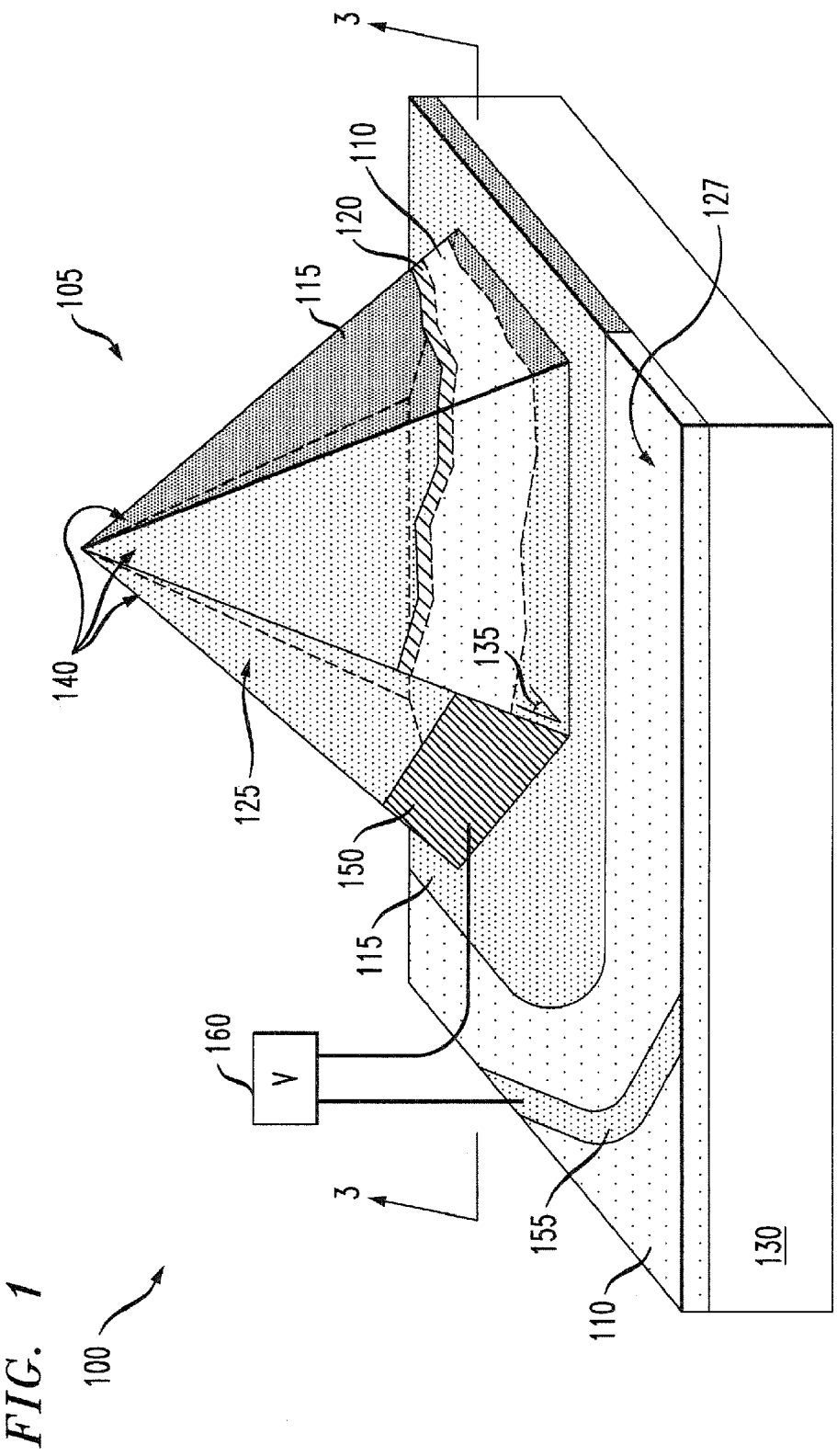
FIG. 1 illustrates a perspective view of an example apparatus.

One embodiment of the invention is an apparatus. FIG. 1 presents a perspective view of an example apparatus 100, such as an LED or other illuminating apparatus comprising an LED. The apparatus 100 comprises a light-emitting crystalline structure 105 having an n-type barrier region 110 and a p-type barrier region 115. There is junction 120 between the n-type and p-type barrier regions 110, 115. Portions of the interior p-type barrier region 115 and junction 120 are shown in a cut-away view in FIG. 1. The junction 120 is located on an inclined surface 125 of one of the n-type or p-type barrier regions 110, 115. The incline of the surface 125 is relative to a planar surface 127 of a substrate 130. As well understood to those skilled in the art, the junction 120 comprises an active region that emits light when a voltage (V) is applied between the n-type and p-type regions 110, 115.

The inclined surface 125 refers to a grown or wet etch-revealed surface of one of the n-type and p-type barrier regions 110, 115 that deviates from the horizontal planar surface 127 of the substrate 130 that the structure 105 is located on. E.g., for n-type and p-type barrier regions 110, 115 that comprise a group III-nitride, the horizontal plane 127 can correspond to a (0001) or a (000$\bar{1}$) plane of a substrate 130 (e.g., an insulating substrate such as sapphire) and the inclined surface 125 can correspond to one of the family of {1$\bar{1}$0$\bar{1}$} planes.

The term group III-nitride as used herein refers to a metal nitride or metal alloy nitride, where the metal comprises one or more atoms from Group III of the Periodic Table of Elements. Examples include aluminum nitride, gallium nitride, indium nitride, or combinations thereof. In some cases, the n-type and p-type barrier regions 110, 115 include dopants to form an n-type and p-type material. Examples of suitable n-type and p-type dopants include silicon and magnesium, respectively.

The examples to follow feature Wurtzite crystal structures comprising group III-nitrides. However, one skilled in the art would appreciate that the invention could be applied to any light emitting crystal structure having non-inversion symmetry. Examples of other light-emitting crystal structures having non-inversion symmetry include Group II-VI compounds, such as Zinc Oxide (ZnO), Magnesium Zinc Oxide (Mg-ZnO), Cadmium Zinc Oxide (CdZnO) and combinations thereof.

As illustrated in FIG. 1, the inclined surface 125 deviates from the horizontal planar surface 127 of the substrate 130. In some preferred embodiments the inclined surface 125 is configured to form an angle 135 that results in the reduction or cancellation of the internal electric field of the n-type or p-type barrier regions 110, 115. E.g., for certain n-type or p-type barrier regions 110, 115 comprising group III-nitrides, an angle 135 ranging from 55 to 65 degrees, and in some cases 55 to 60 degrees, causes the sum of piezoelectric polarization and spontaneous polarization in the junction 120 to cancel each other, resulting in a substantially zero electric field.

It is advantageous to form structures 105 that provide one or more inclined surface 125 having the desired angle 135. In some preferred embodiments, the apparatus 100 can comprise a structure 105 comprising group III-nitrides and a junction 120 between n-type and p-type group III-nitrides therein 110, 115, the structure 105 having a pyramidal shape or a wedge shape.

In some embodiments, such as shown in FIG. 1, the structure 105 has a pyramidal shape, and more specifically a hexagonal pyramid. In this case, the inclined surface 125 corresponds to six facets 140 of the pyramid structure 105 located over the substrate 130. The pyramid structure 105 can be formed using a wet etch process as discussed below.

Figure 2:
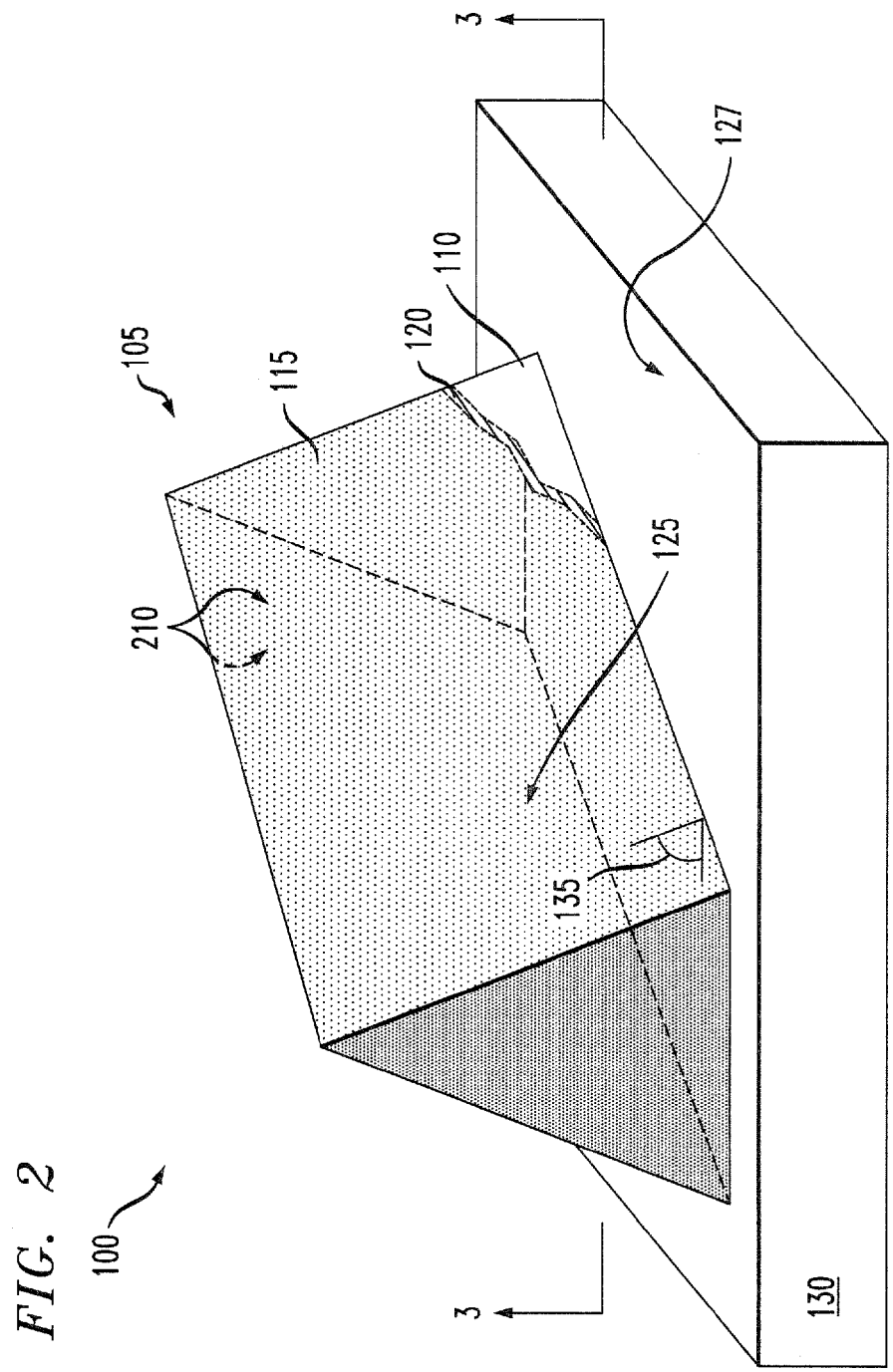
FIG. 2 illustrates a perspective view of an alternative example apparatus.

In other embodiments, such as shown in FIG. 2 (using the same reference numbers as FIG. 1) the structure 105 has a wedge shape. In this case, the inclined surface 125 corresponds to the two facets 210 of the wedge structure 105 located over the substrate 130. The inclined surface 125 can correspond to one family of $\{11\bar{2}2\}$ planes. The wedge structure 105 can be formed by a chemical vapor deposition (CVD), such as described in Srinivasan et al., Applied Physics Letters 87:131911, 2005, which is incorporated by references in its entirety.

It is desirable for the structures 105 to have a plurality of inclined surfaces 125 because this increases the external efficiency of the structure 105. For instance, having a plurality of inclined surfaces 125 corresponding to the six facets 140 of the hexagonal pyramid structure 105 (FIG. 1) is preferred over a structure 105 having a plurality of inclined surfaces 125 corresponding to the two facets 210 of the wedge structure 105 (FIG. 2). The larger number of facets 140 of the pyramid structure 105 provides more surfaces for light to reflect off of at an angle that is below the critical angle of the crystal structure 105, and therefore a greater number of escape routes from the structure 105.

Figure 3:
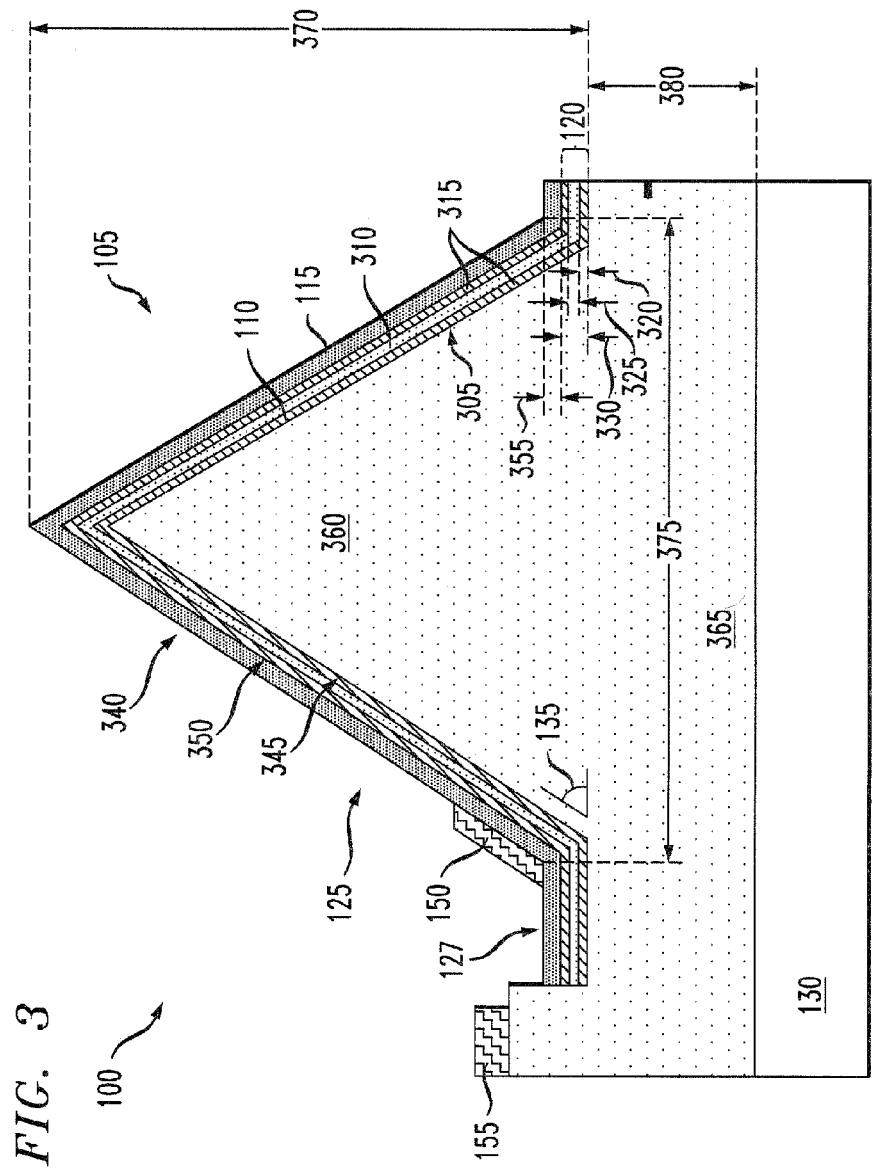
FIG. 3 illustrates a cross-sectional view of a portion of the example apparatus shown in FIG. 1.

FIG. 3 presents a cross-sectional view along view line 3-3, which traverses through one of the facets 140 shown for the pyramidal-shaped structure 105 depicted in FIG. 1. The cross-sectional view shown in FIG. 3, however, could also correspond to view line 3-3, as depicted in FIG. 2, which transverse through a plane perpendicular to the facets 210 of the wedge-shaped structure 105.

As further illustrated in FIG. 3, to improve the amount of light being emitting from the structure 105, it is desirable for the junction 120 to include a quantum well 305. Some embodiments of the quantum well 305 comprise a group III-nitride.

All three of the n-type region 110, the p-type region 115, and the quantum well 305 are pyramid-shaped when the structure 105 is pyramid-shaped. Alternately all three of the n-type region 110, the p-type region 115, and the quantum well 305 are wedge-shaped when the structure 105 is wedge-shaped. Having such configurations beneficially improves the internal light emission efficiency because it provides the inclined surface 125 needed to reduce the structure's 105 internal electric field. These configurations also advantageously improve the external light emission efficiency of the structure 105. That is, there will be less internally reflected light from a quantum well 305 located on the inclined surface 125 compared to light from a quantum well of similar composition, but located on a planar surface.

The composition of the group III-nitride of the quantum well 305 is different than the compositions of the group III-nitrides of n-type and p-type barrier regions 110, 115. It is important to select the compositions of the quantum well 305 and the n-type and p-type barrier regions 110, 115 so as to configure the n-type and p-type barrier regions 110, 115 to have a larger band gap than the quantum well 305. Group III-nitrides having aluminum (e.g. $Al_xGa_{1-x}N$) will cause these materials to have a wider band gap, while a group III-nitride having indium (e.g. $In_yGa_{1-y}N$) causes these materials to have a narrower band gap.

For example, in some preferred embodiments, the n-type and p-type barrier regions 110, 115 comprises gallium nitride, while the quantum well 305 comprises an alloy of indium and gallium (e.g., indium gallium nitride). In other embodiments, the n-type and p-type barrier regions 110, 115 comprise an aluminum gallium alloy (e.g., aluminum gallium nitride) and the quantum well 305 comprises gallium nitride. In still other embodiments, n-type and p-type barrier regions 110, 115 comprise an aluminum-rich aluminum gallium alloy (e.g., AlGaN having a ratio of Al:Ga:N of about 80:20:100) and the quantum well 305 comprises an aluminum-poor aluminum gallium alloy (e.g., AlGaN having a ratio of Al:Ga:N of about 60:40:100 AlGaN). In still other cases, the n-type and p-type barrier regions 110, 115 comprise indium aluminum nitride or indium gallium aluminum nitride, and the quantum well 305 comprises indium gallium nitride. One skilled in the art would appreciate that other combinations of group III-nitrides alloys could be used.

As further illustrated in FIG. 3, the quantum well 305 can have one or more quantum well layers 310 and one or more barrier layers 315 therein. Example quantum well layers 310 and barrier layers 315 are presented in U.S. Pat. No. 6,891,187 to Cho et al., which is incorporated by reference herein in its entirety.

Each quantum well layer 310 is preferably interposed between barrier layers 315. In cases where there is more than one quantum well layer 310, the quantum well layers 310 are separated from one another by barrier layers with a larger bandgap than the quantum well layers. In some preferred embodiments, each barrier layer 315 has a thickness 320 of about 10 to 50 Angstroms, and each quantum well layer 310 has a thickness 325 of about 5 to 50 Angstroms. In some preferred embodiments the quantum well 305 comprises 1 to 8 quantum well layers 310. Having multiple quantum well layers 310 beneficially increases the probability of carrier capture into the quantum well 305. However, if there is too large a number of quantum well layers 310, then carriers may not be distributed evenly through the different layers 310.

The quantum well region 310 and barrier layers 315 can comprise any of the combinations of the material described above for the quantum well 305 and the n-type and p-type regions 110, 115, respectively. It is preferable for the compositions of the quantum well region 310 and barrier layers 315 to be configured so that the quantum well region 310 has a narrow band gap and the barrier layers 315 has a wider band gap.

The quantum well layer 310 can comprise one type of group III-nitride, while the barrier layers 315 can comprise another type of group III-nitride. E.g., the quantum well layer 310 can comprise InGaN, while the barrier layers 315 comprises GaN. In some preferred embodiments, the quantum well layer 310 comprises InGaN having a ratio of In:Ga:N ranging from about 15:85:100 to 20:80:100, and even more preferably, about 17:83:100. This composition is advantageous because the internal electric fields of the quantum well layers 310 are substantially reduced when located on an inclined surface 120 having an angle 135 of e.g., about 55 to 65° with respect to the substrate 130. Such angles 135 are attained for the facets 140, 210 of pyramidal (FIG. 1) or wedge (FIG. 2) shaped structures 105 that comprise, e.g., group III-nitrides.

In some embodiments, the quantum well 305 has a thickness 330 ranging from about 2.5 to 5 nanometers. In cases where the quantum well comprises a plurality of quantum well layers 310 and barrier layers 315, the thickness 330 refers to the sum of the thicknesses of these layers 310, 315. In some cases, it is desirable for the variation in the thickness 330 of the quantum well 305 (or its component layers 310, 315) throughout the entire structure 105 to be about ±5% or less. This low thickness variation is desirable because it minimizes the range of wavelengths of light emitted from the structure 105. Thin-film deposition techniques such as molecular beam epitaxy (MBE) can be used, e.g., to fabricate such a low thickness variation layers of quantum well 305. In other cases, however, where a broader range of emitted wavelengths is desired, other techniques, such CVD can be used to produce quantum wells 305 whose thickness 330 varies by more than ±5%. E.g., the thickness 330 within any one structure 105 can range from about 2.5 to 5 nanometers.

In the above discussion of the examples shown in FIGS. 1-3, the p-type barrier region 115 is presented as an outer layer 340 of the structure 105, and the n-type barrier region 110 is shown as an interior region 345 of the structure 105. In other embodiments, however, the n-type barrier region 110 could be the outer layer 340 and the p-type barrier region 115 could be the interior region 345. The junction 120, or optional quantum well 305, is a middle layer 350 on the inclined surface 125 of the interior region 345.

In some embodiments, the outer layer 340, comprising either one of an n-type or p-type group III-nitride that has a thickness 355 ranging from about 50 to 500 nanometers.

As further illustrated in FIG. 3, the interior region 345 can comprise one or more pyramidal portion 360 located on a base portion 365. The base 365 can be a substantially planar base that is part of the substrate 130 that the structure 105 is located on. For clarity only a single pyramid 360 is depicted in FIGS. 1 and 3. However, in other embodiments the structure 105 comprises a plurality of pyramids 360 that are on a common base 365. That is, the pyramids 360 are interconnected via the base 365. Having the pyramids 360 interconnected via the base 365 facilitates the coupling of one of the n- or p-type barrier region 110, 115 to ohmic contacts 150, 155 that are in turn coupled to an electrical source 160 configured to apply a voltage (V) between these regions 110, 115.

As shown in FIG. 3, both the pyramid 360 and the base 365 are covered with the middle layer 350 of the quantum well 305, and the outer layer 340 of the other of the n-type or p-type barrier regions 110, 115. In some preferred embodiments the pyramid 360 has a height 370 and width 375 ranging from about 100 nm to 2 microns, and the base 365 has a thickness 380 of about 500 nm to 100 microns. It is desirable for the height 370 of the pyramid 360 to not exceed about 2 microns because taller structures can interfere with the formation of planar photoresist layers in subsequent processing steps.

The pyramid 360 formed by a partial wet etch of the base 365. Wet etch processes can be designed to remove material from a specific surface of crystal structures to reveal the pyramid 360. Examples of such wet-etch processes are presented in U.S. Pat. No. 6,986,693 to Chowdhury et al., which is incorporated by reference herein in its totality. For example, the nitrogen-polar (N-polar) surface of a Group III-nitrides crystal is more susceptible to a base wet etch than a metal-polar (M-polar) surface. One skilled in the art would understand that N-polar surface refers to a face of a Group III-nitride Wurtzite structure having a straight bond (in a tetragonal bonding configuration) from a Nitrogen atom to a Group III metal atom. An M-polar surface refers to a face having the straight bond from a Group III metal atom to the Nitrogen atom. The base wet etch etches the $\{1\overline{1}0\overline{1}\}$ planes of a Group III-nitride crystal (e.g., GaN) to produce a hexagonal-shaped pyramidal structure 105 (FIG. 1). The hexagonal pyramidal structure 105 has six facets 140 of the $\{1\overline{1}0\overline{1}\}$ family. In some preferred embodiments, the hexagonal-shaped pyramidal shaped structure 105 has a base-to-facet angle 135 of about 58.4 degrees.

As further illustrated in FIGS. 1 and 3, the p-ohmic contact 150 touches the p-type barrier region 115 and the n-ohmic contact 155 touches the n-type barrier region 110. The ohmic contacts 150, 155 comprise one or more layers of conductive material such as titanium, aluminum, nickel, platinum, gold or alloys thereof. The electrical source 160 is configured to apply a voltage (e.g., V of about 0.5 to 10 Volts, in some embodiments) to the ohmic contacts 150, 155 so as to cause the structure 105 to emitting light.

Another aspect of the invention is a method of manufacturing an apparatus. FIGS. 4-20 show cross-sectional views of selected steps in an example method of manufacturing an apparatus 400. Any of the embodiments of the example apparatuses depicted in FIGS. 1 and 3 could be manufactured by the method.

FIGS. 4-8 show selected steps in forming a light-emitting crystalline structure 405 of the apparatus 400. Forming the structure includes forming a first barrier region on a substrate, the first barrier region having one or more inclined surfaces relative to a planar surface of the substrate. FIG. 4-7 illustrate selected steps in forming the first barrier region.

Figure 4:
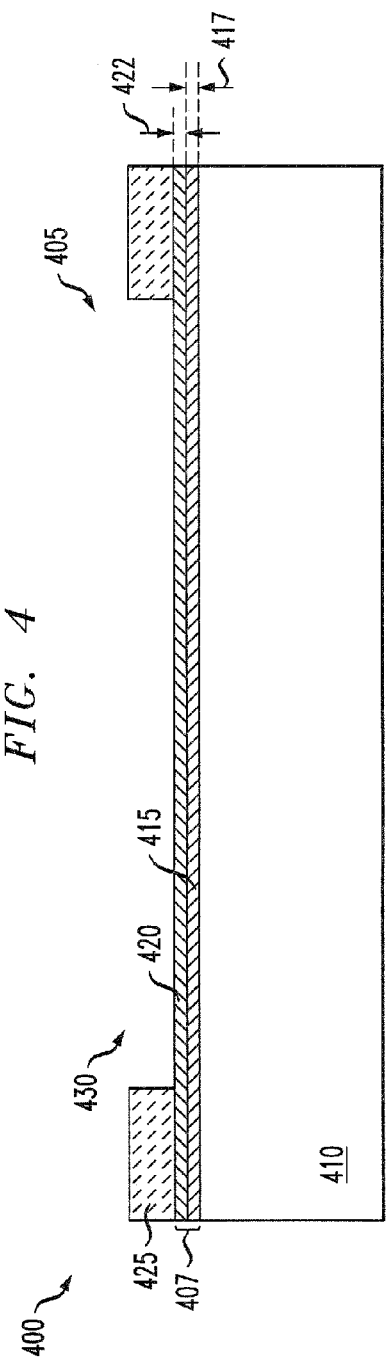
FIGS. 4-14 presents cross-sectional and plan views of an example apparatus at selected steps in an example method of manufacture.

FIG. 4 shows the apparatus 400 after forming a barrier region seed layer 407 on a substrate 410. Sapphire is a preferred substrate 410 because it facilitates formation of a subsequently grown N-polar barrier region on the substrate 410. Forming the barrier region seed layer 407 can comprise growing, via MBE, an AlN seed layer 415 (thickness 417 of about 20 nm) on the substrate 410 and a group III-nitride (e.g., GaN) seed layer 420 (thickness 422 of about 50 nm) on the AlN seed layer 415. The AlN seed layer 415 is preferred because it facilitates the growth of a subsequently grown M-polar barrier region on the substrate 410. The group III-nitride layer 420 protects the AlN seed layer 415 from oxidation until the M-polar barrier region is formed. FIG. 4 also illustrates the apparatus 400 after depositing a photoresist layer 425, e.g., by spin coating, and patterning the photoresist layer 425 to form one or more openings 430. The openings 430 define locations on the substrate 410 where light-emitting crystalline structures 405 are formed.

Figure 5:
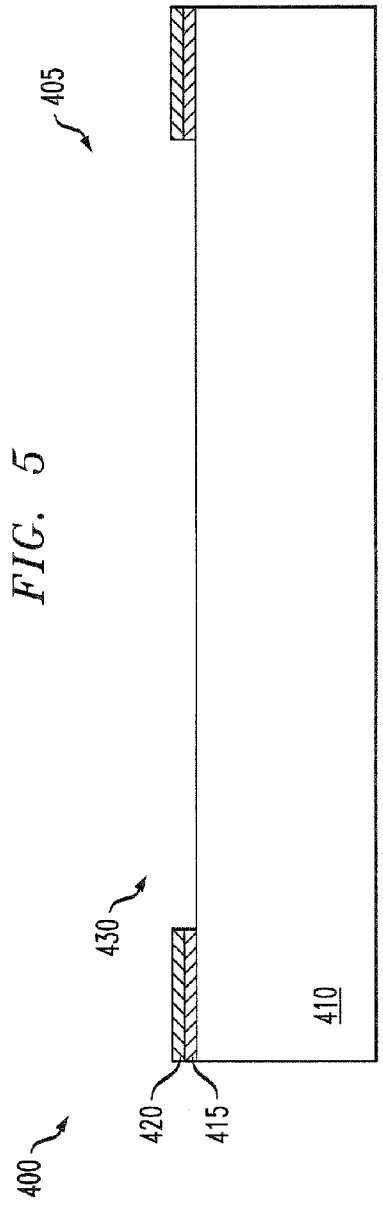

FIG. 5 shows the apparatus 400 after removing portions of the barrier region seed layer 407 that are exposed in the opening 430, and then removing the photoresist layer 425 (FIG. 4). E.g., a plasma etch comprising Cl and Ar can be used to remove the exposed portions of barrier region seed layer 407 to extend the opening 430 down to the substrate 410. E.g., the gas composition can comprise 30 sccm Cl and 10 sccm Ar.

The photoresist 425 is then removed by a conventional process, such as immersion in acetone, followed by 10:1 (by volume) $H_2SO_4:H_2O_2$.

Figure 6:
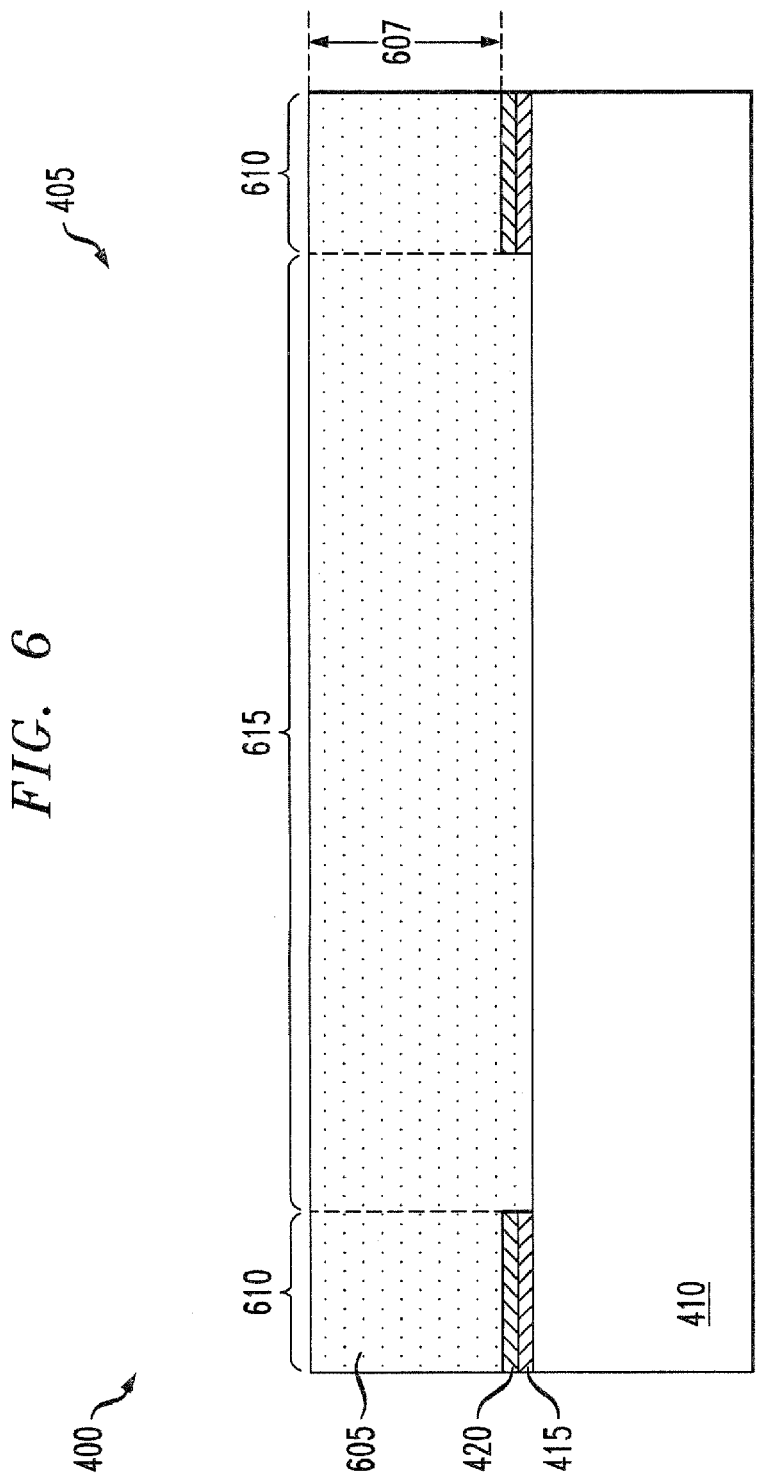

FIG. 6 shows the apparatus after forming a layer of first barrier region 605 on the substrate 410 and on the group III-nitride seed layer 420. E.g., MBE can be used to grow a layer of first barrier region 605 that comprises a group III-nitride and has a thickness 607 ranging from about 1 to 5 micron. The group III-nitride of the first barrier region 605 can be substantially similar in composition to the group III-nitride seed layer 420 of the seed layer 407. E.g., the first barrier region 605 and group III-nitride seed layer 420 can both comprise GaN. The first barrier region 605 comprises one of an n-type or p-type semiconductor crystal to thereby form an n-type barrier region or p-type barrier region. E.g., suitable n-type or p-type dopants, such as silicon or magnesium, respectively, can be included during the MBE growth of the first barrier region 605.

Preferred embodiments of the layer of first barrier region 605 comprise a grown M-polar surface 610 and a grown N-polar surface 615. That is, the layer of first barrier region 605 grown on the barrier region seed layer 407 has the M-polar surface 610, while the layer of first barrier region 605 grown on the substrate 410 that is exposed in the opening 430 has the N-polar surface 615. It is advantageous for the first barrier region 605 to have both the M-polar and N-polar surfaces 610, 615 because this allows one to predefine the location on the substrate 410 where the inclined surface of the first barrier region 605 will be formed.

Figure 7:
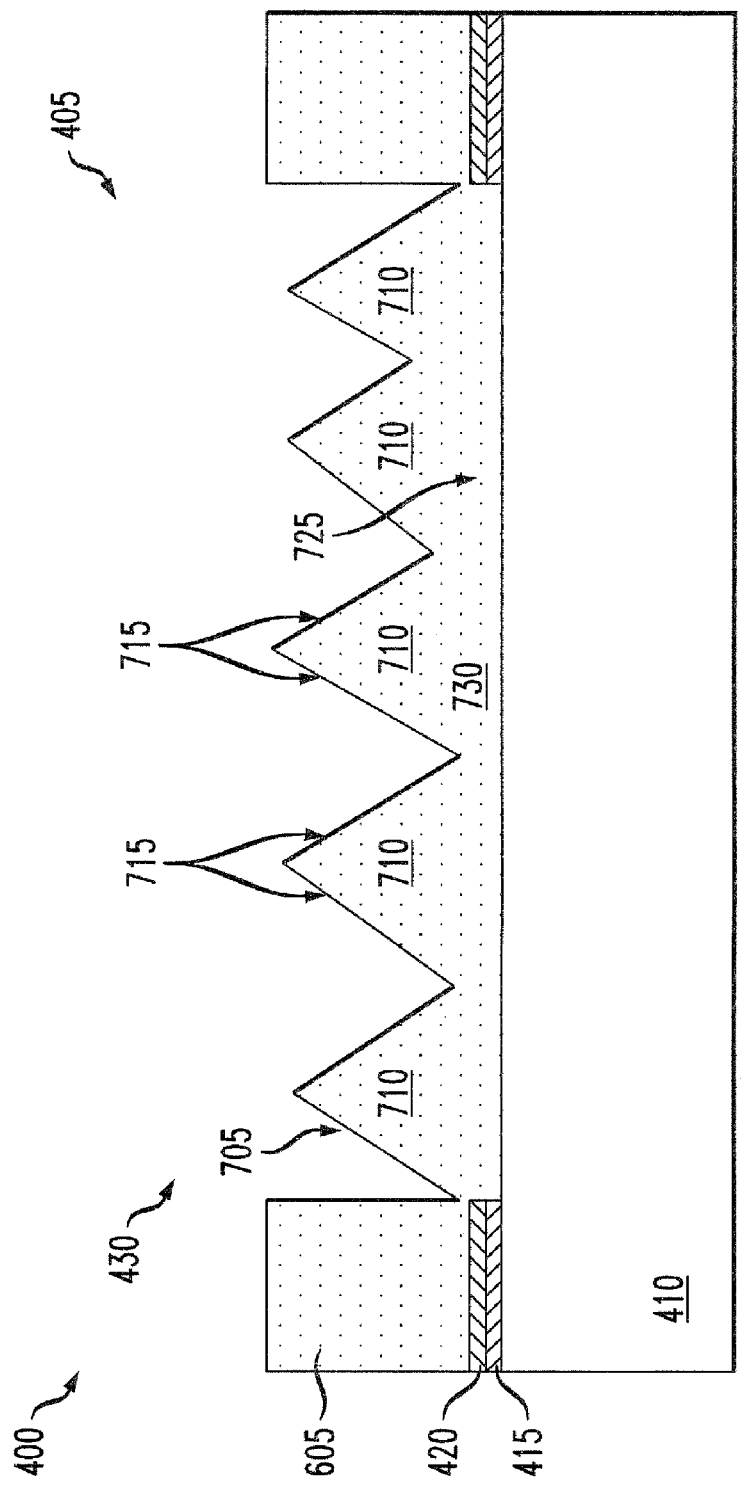

For instance, as shown in FIG. 7, an inclined surface 705 can be formed by wet etching the N-polar surfaces 615, e.g., with a base as discussed above and in U.S. Pat. No. 6,986,693. As illustrated in FIG. 7, the M-polar surface 610 of the first barrier region 605 is comparatively unaffected by the wet etch. When the first barrier region 605 comprises Group III-nitrides (e.g., GaN), wet etching the N-polar surfaces 615 causes rapid etching of the family of $\{1\bar{1}0\bar{1}\}$ planes to form one or more hexagonal pyramid 710. The inclined surfaces 705 comprise facets 715 of the pyramid 710. In some cases, the inclined surface 705 can form an angle 720 ranging from about 55 to 65° with respect to a horizontal planar surface 725 of the substrate 410. As shown in FIG. 7, the wet etching can form a plurality of interconnected pyramids 710 on a base portion 730 of the first barrier region 605. The pyramids 710 and the base portion 730 both comprise a same material of the first barrier region 605.

Figure 8:
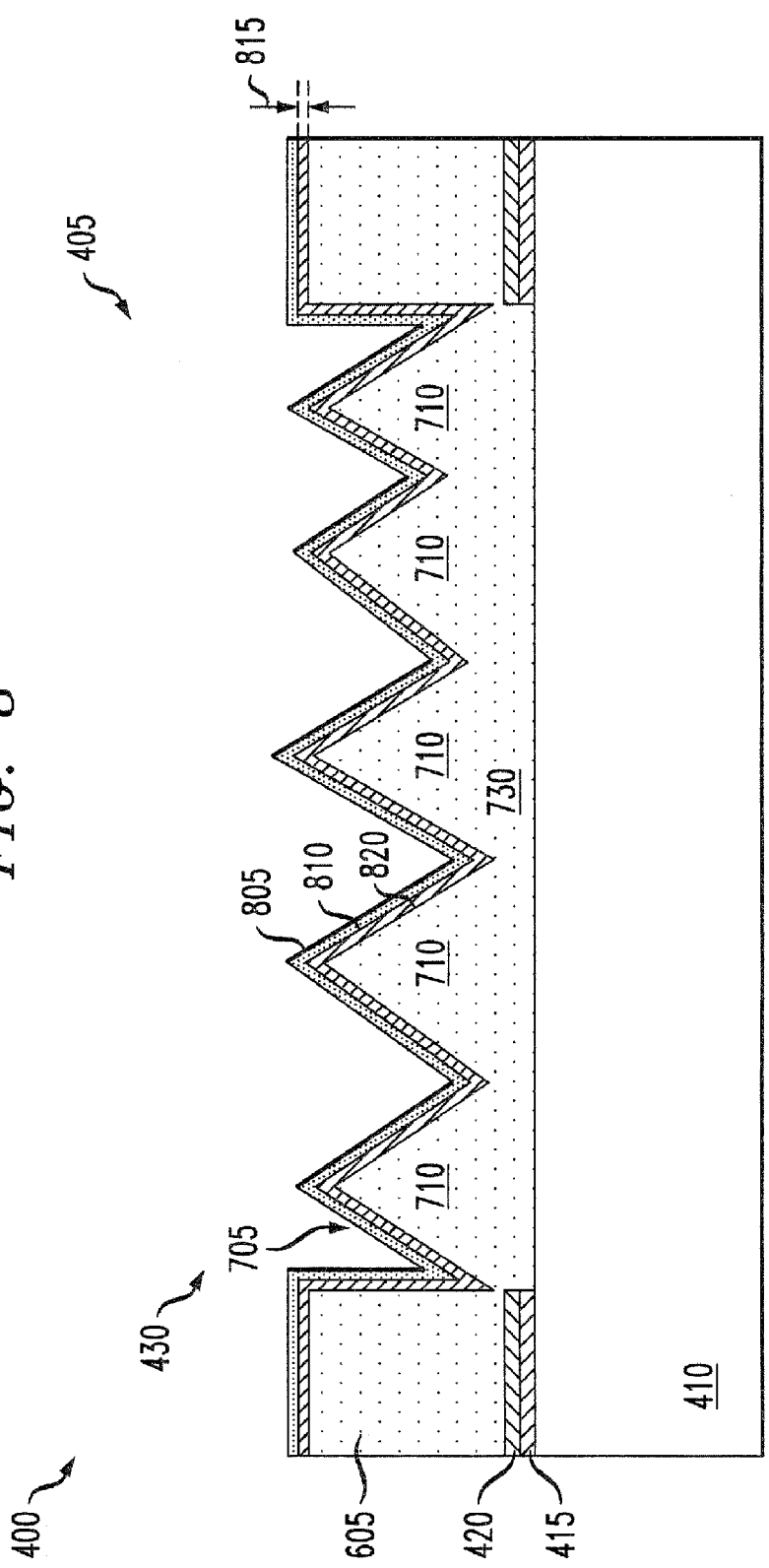

FIG. 8 shows the apparatus 100 after forming a second barrier region 805 over the first barrier region 605, thereby forming a junction 810 at the inclined surfaces 705. The second barrier region 805 comprises the other of the n-type or p-type semiconductor crystal that the first barrier region 605 does not comprise. Preferred embodiments of the second barrier region 805 comprise a group III-nitride. MBE can be used to grow a layer of the second barrier region 805 that comprises a group III-nitride having a thickness 815 ranging from about 50 to 500 nanometers. MBE is preferred because it can form the second barrier region 805 with a minimum variation in the thickness 815. In some cases, the second barrier region 805 is deposited over, and in some cases on, the plurality of interconnected pyramids 710 on a base portion 730.

As further illustrated in FIG. 8, a quantum well 820 can be formed on the first barrier region 605 before forming the second barrier region 805. In such instances, the junction 810 comprises the quantum well 820. The quantum well 820 comprising a group III-nitride can be formed, e.g., via MBE on the plurality of interconnected pyramids 710 on a base portion 730, and then the second barrier region 805 is formed on the quantum well 820.

Figure 9:
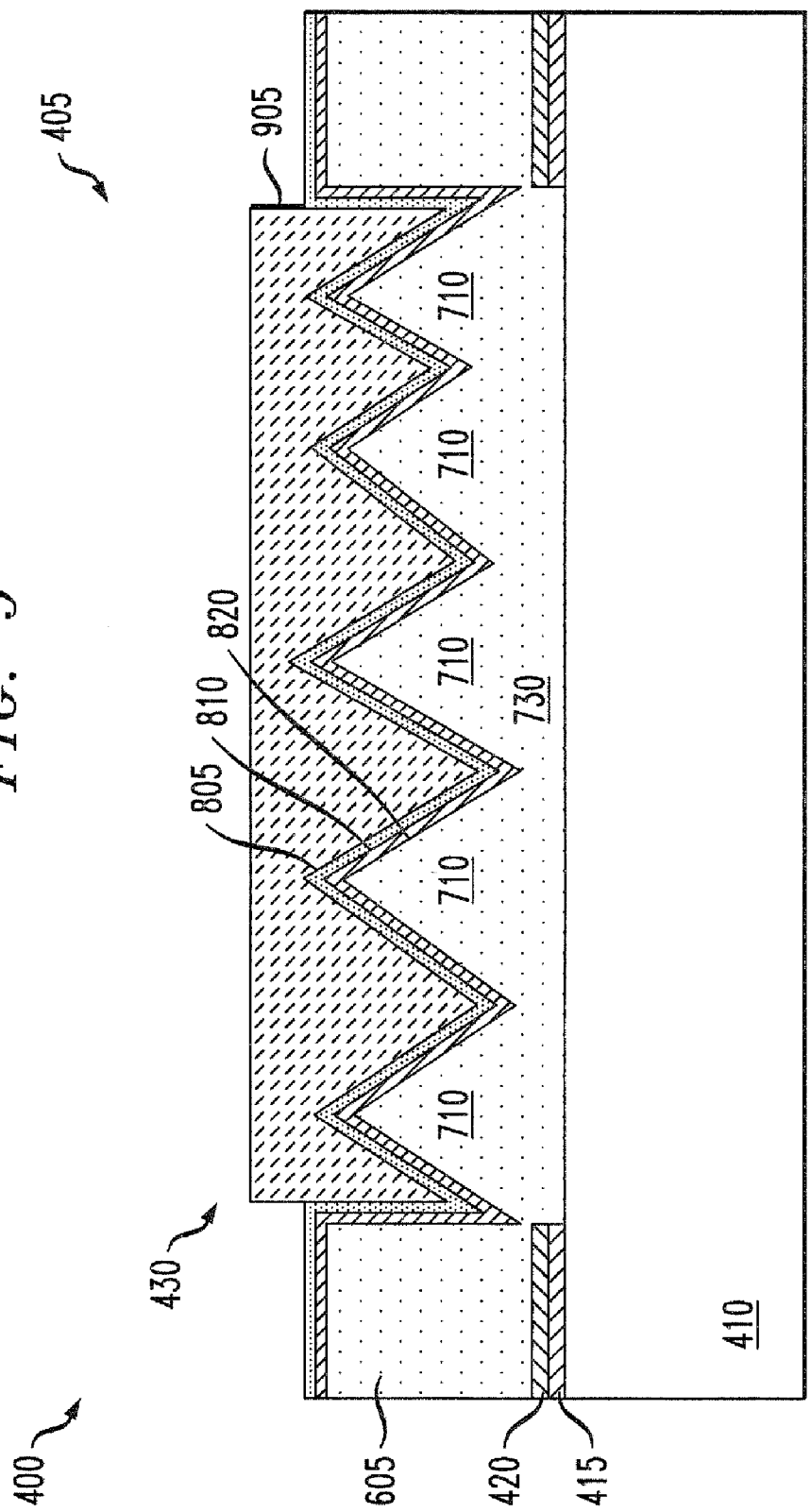

FIGS. 9-13 show selected steps in forming contacts to the first and second barrier regions 605, 805. FIG. 9 shows the apparatus 100 after filling the opening 430, with second photoresist 905. The photoresist 905 thereby covers portions of the first barrier region 605, the second barrier region 805 and optional quantum well 820 that are located inside the opening 430.

Figure 10:
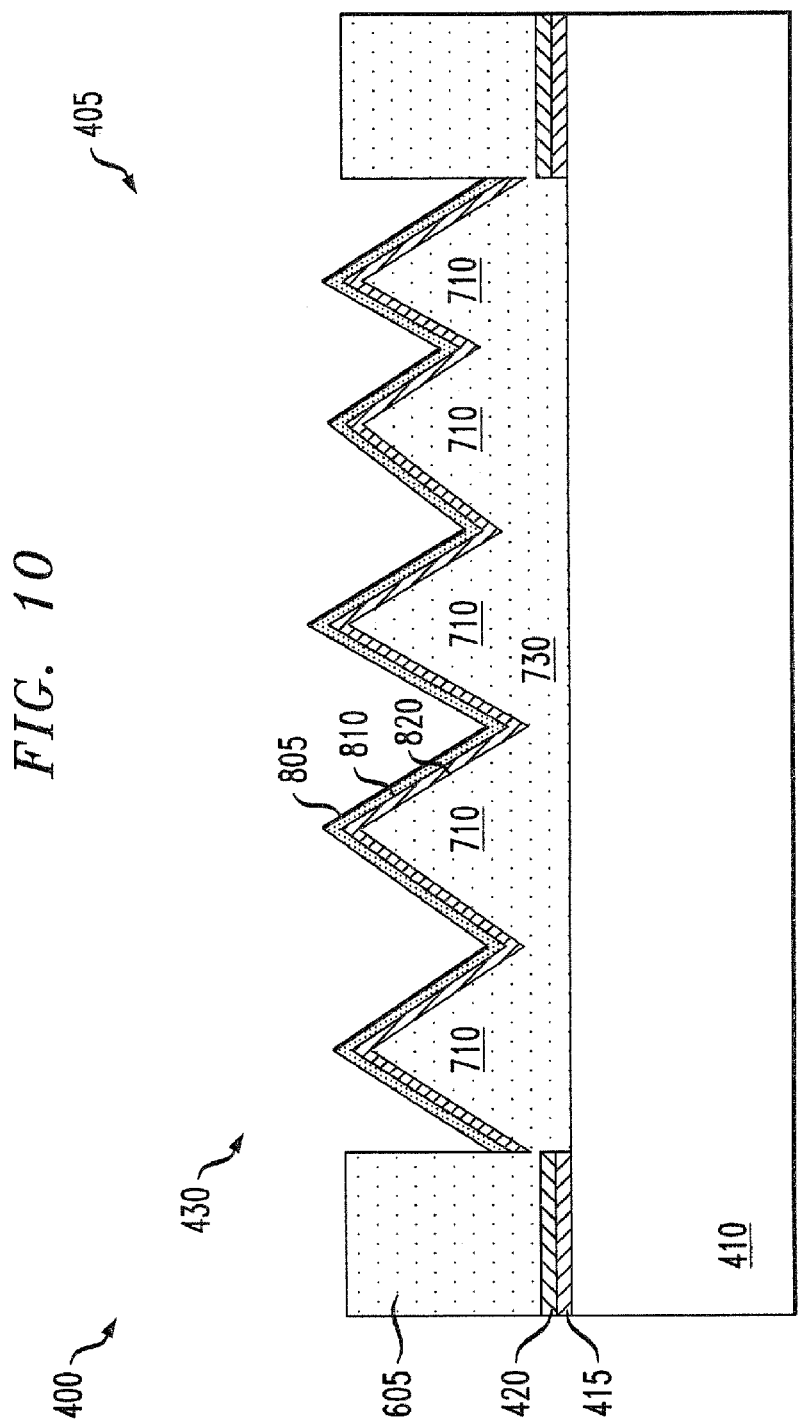

FIG. 10 illustrates the apparatus 100 after exposing the M-polar surface 610 of the first barrier region 605. E.g., a plasma etch comprising Ar and Cl can be used to remove the portions of the second barrier region 805 and the optional quantum well 820, that are outside of the opening 430 and not covered with the photoresist 905. The photoresist 905 protects the first barrier region 605, the second barrier region 805 and optional quantum well 820 in the opening 430 from being etched. Thereafter, the photoresist 905 is removed.

Figure 11:
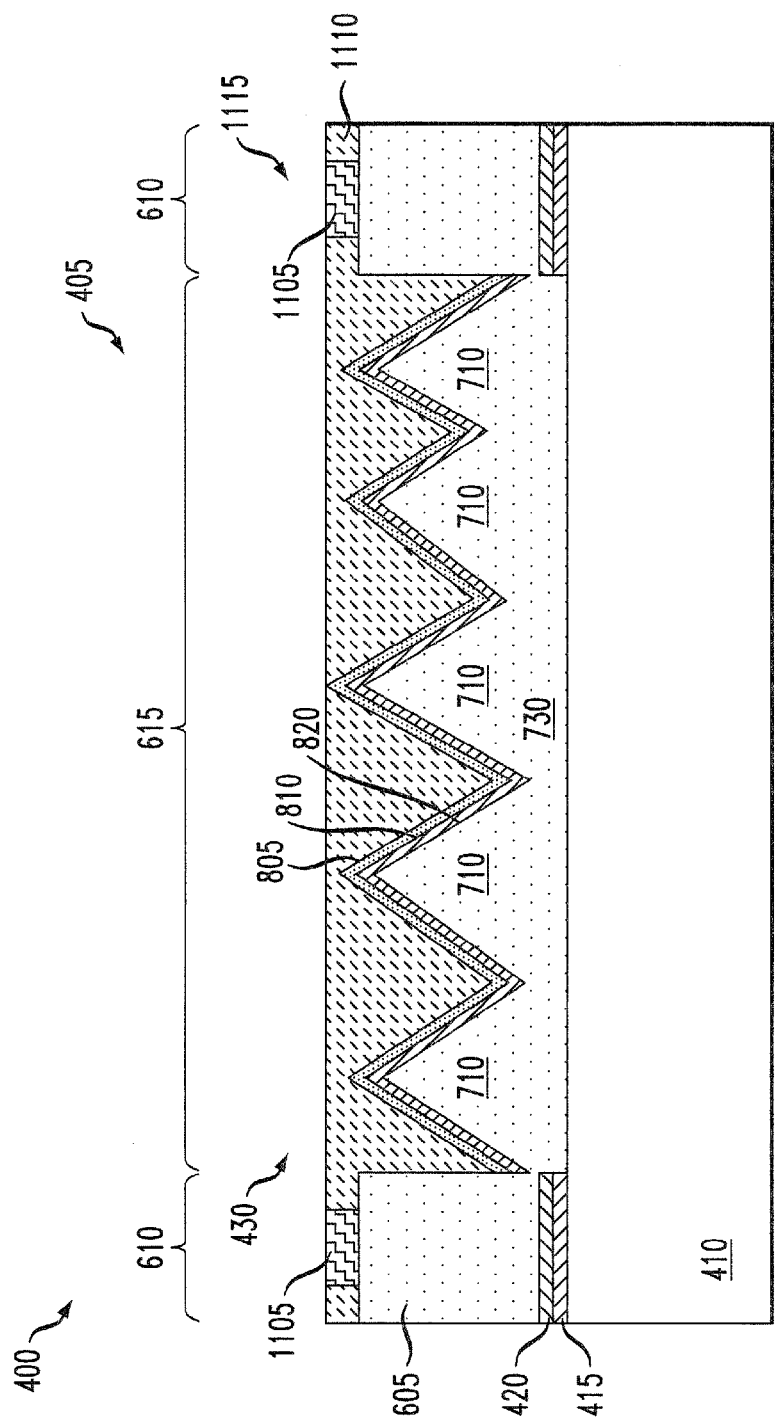

FIG. 11 depicts the apparatus 100 after depositing a first ohmic contact 1105 on the M-polar surface 610 of the first barrier region 605. The first ohmic contact 1105 can be formed by a conventional metal lift-off process. E.g., a third photoresist 1110 can be deposited and patterned to form an opening 1115 to the barrier region 605 and located around the light-emitting crystal structure 405. The material of the first contact 1105 (e.g., aluminum, titanium, gold) can be deposited in the opening 1115 on the M-polar surface 610 of the first barrier region 605 using conventional metal deposition technique such as electron beam deposition. In some preferred embodiments, first contact 1105 comprises four consecutively deposited layers of titanium, aluminum, titanium, and gold on the first barrier region 605 configured as an n-type barrier region.

Figure 12:
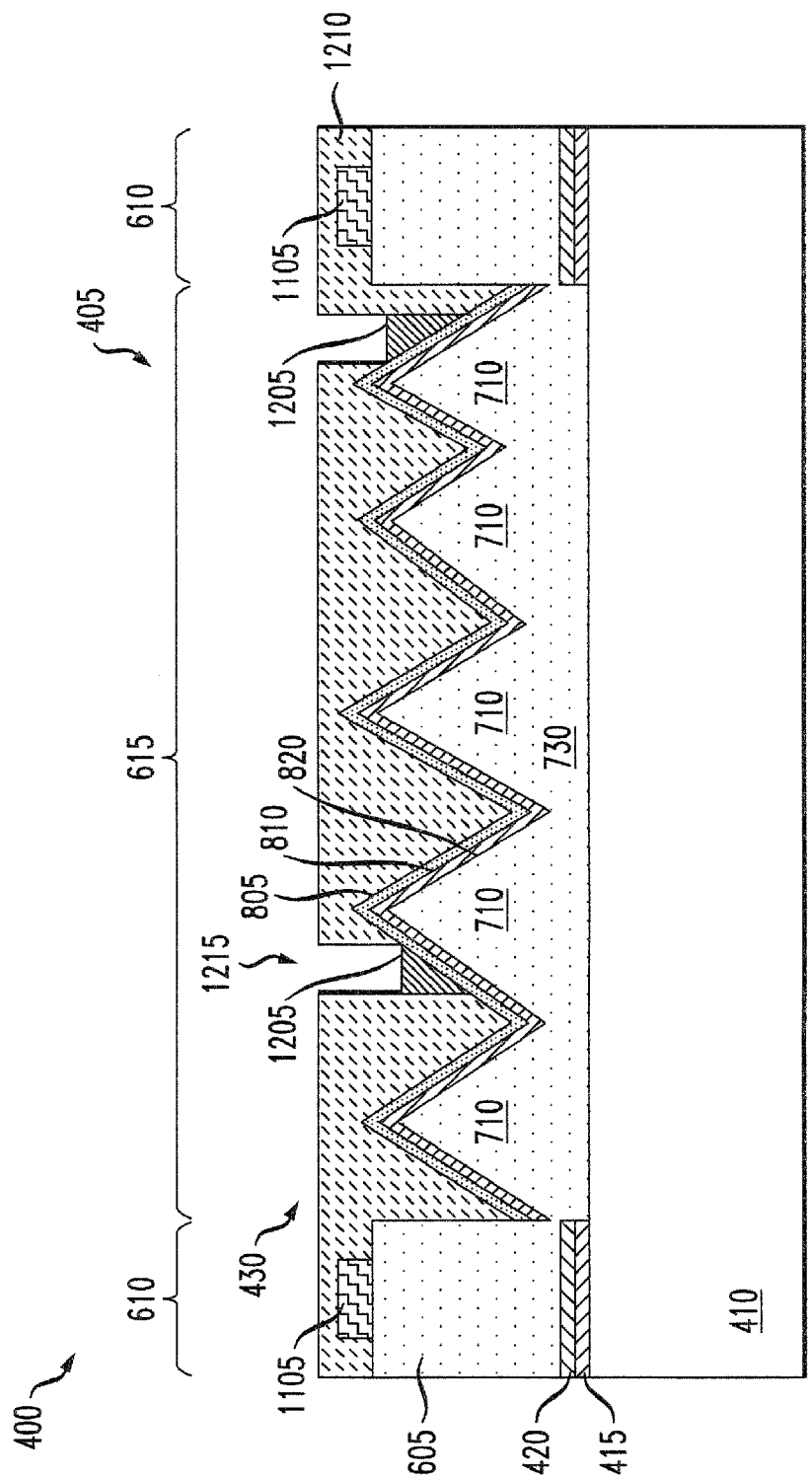

FIG. 12 shows the apparatus 100 after depositing a second ohmic contact 1205 on the second barrier region 805. E.g., a fourth photoresist 1210 can be deposited and patterned to form an opening 1215 to the second barrier region 805 and located within the light-emitting crystal structure 405. As illustrated, the second barrier region 805 is located over or on the N-polar surface 615 of the first barrier region 605 and the second contact 1205 is over or on the second barrier region 805. In some preferred embodiments, the second ohmic contact 1205 comprises a different material than the first contact 1105. E.g., in some preferred embodiments, second contact 1205 comprises two consecutively deposited layers of nickel and gold on the second barrier region 805 configured as a p-type barrier region.

Figure 13:
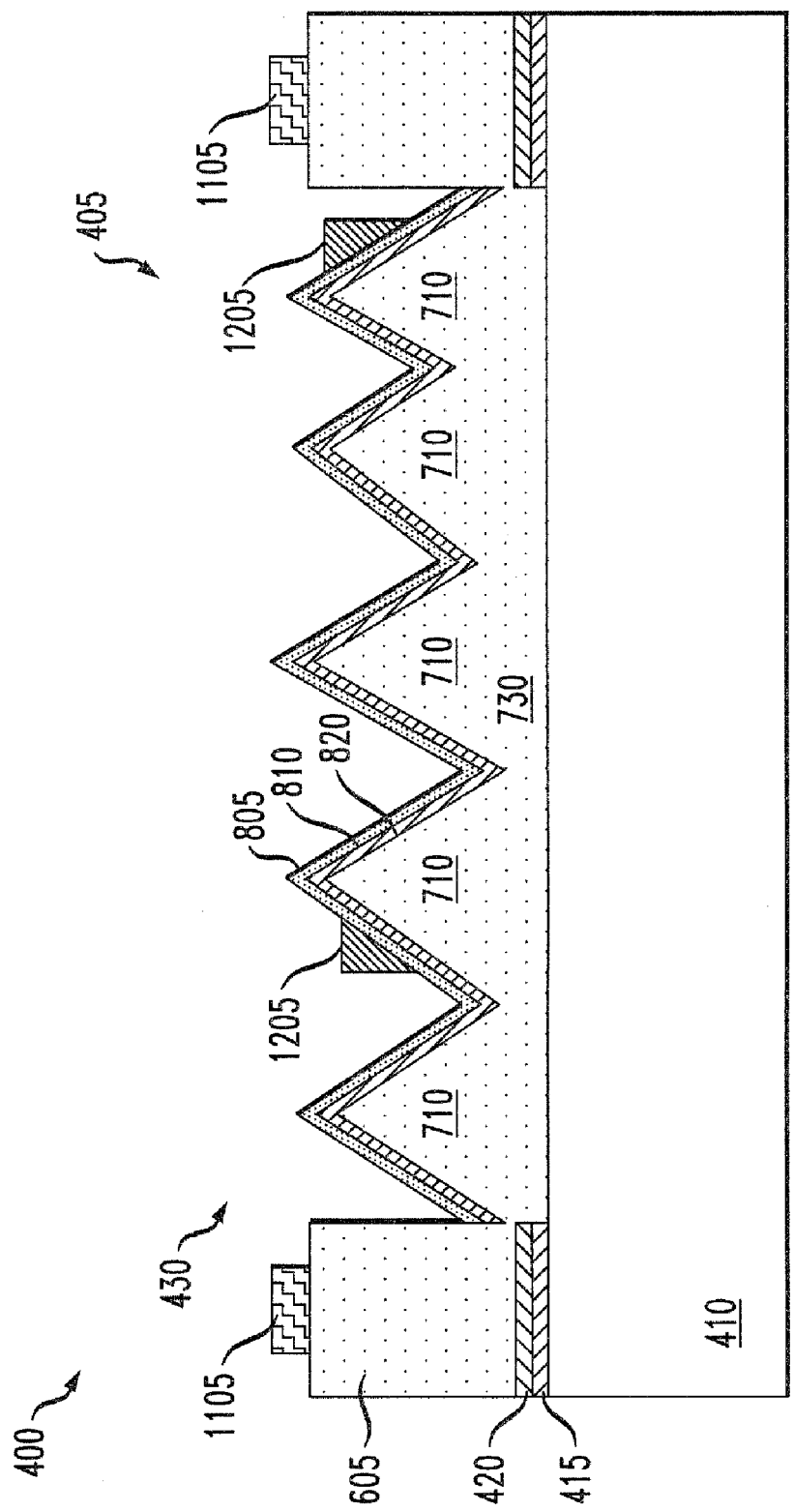
Figure 14:
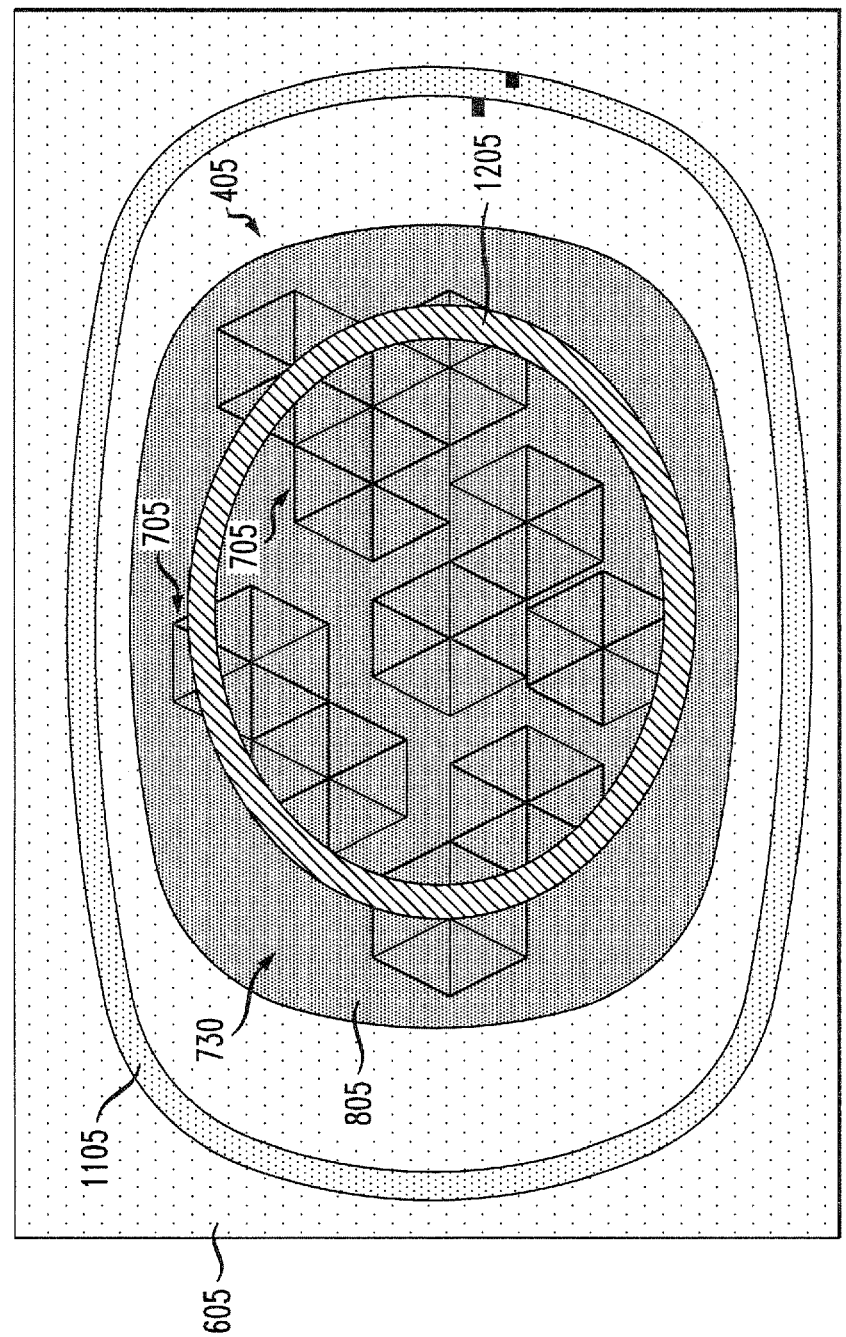

FIG. 13 depicts the apparatus 100 after lifting-off the photoresist layer 1210 (FIG. 12). FIG. 14 shows a plan view of the apparatus 100 such as depicted in FIG. 13. As illustrated for the embodiments shown in FIGS. 13 and 14, the first contact 1105 need not cover the entire M-polar surface 610. This follows because the portion of the first barrier region 605 having the M-polar surface 610 is in electrical contact with portion of the first barrier region 605 having the N-polar surface 615. E.g., the base 730 below the pyramids 710 touches the first barrier region 605 that is under the M-polar surface 610. Therefore, the first contact 1105 is also in electrical contact with the inclined surfaces 705 and the junction 810 of the structure 405.

Similarly, the second contact 1205 does not need to cover the entire second barrier region 805 formed on each inclined surface 705 of the structure. When the second barrier region 805 forms a uniform coating over interconnected pyramids 710 and the base 730 of the first barrier region 605, then a second contact 1205 touching any portion of the second barrier region 805 is also in electrical contact with the inclined surfaces 705 and the junction 810 of the structure 405. Having the structure 405 comprise a uniform coating of second barrier region 805 over a plurality interconnected pyramids 710 advantageously allows one more flexibility as to the placement of the second contact 1205. This avoids the need to align the second contact 1205 with a specific location on each pyramid 710, which can problematic because the exact location of where a pyramid 710 will form by the wet etch process can be unpredictable.

Although the embodiments have been described in detail, those of ordinary skill in the art should understand that they could make various changes, substitutions and alterations herein without departing from the scope of the invention.

What is claimed is:

1. An apparatus, comprising:
   a structure comprising an n-type group III-nitride layer and a p-type group III-nitride layer and a junction between the n-type and the p-type group III-nitride layers therein, the structure having a plurality of pyramids of group III-nitride; and
   wherein a quantum well is located at the junction, and
   wherein a continuous surface of one of the n-type group III-nitride layer and the p-type group III-nitride layer forms outer surfaces of at least two of the pyramids.

2. The apparatus of claim 1, wherein the structure is configured to emit light from the pyramids when a voltage is applied between the n-type and p-type group III-nitride layers.

3. The apparatus of claim 2, wherein the quantum well has a quantum well layer and barrier layers, the quantum well layer being interposed between the barrier layers, wherein the quantum well layer comprises one group III-nitride and the barrier layers comprise another group III-nitride.

4. The apparatus of claim 3, wherein the one group III-nitride of the quantum layer comprises an alloy of gallium and indium or an alloy of gallium and aluminum, and the other group III-nitride of the barrier layers comprises gallium nitride.

5. The apparatus of claim 1, wherein the other of the n-type group III-nitride layer and the p-type group III-nitride layer includes pyramidal structures and a continuous base portion continuously interconnecting the pyramidal structures.

6. The apparatus of claim 5, wherein apexes of each of the pyramids point away from a planar surface of the base portion.

7. The apparatus of claim 1, further including a first ohmic contact located on the one of the n-type group III-nitride layer and the p-type group III-nitride layer, and a second ohmic contact located on the other of the n-type group III-nitride layer and the p-type group III-nitride layer, wherein the outer surfaces are substantially not covered by the first ohmic contact or the second ohmic contact.

8. The apparatus of claim 1, wherein the other of the n-type group III-nitride layer and the p-type group III-nitride layer has a nitrogen-polar surface at the junction.

9. The apparatus of claim 1, wherein the quantum well is a quantum well layer.

10. The apparatus of claim 1, wherein the pyramids are hexagonal pyramids.

11. An apparatus, comprising:
    a plurality of crystalline structures being located on a substrate and being configured to emit light, each of the structures having an n-type barrier region and a p-type barrier region and a junction there between, the junction being located at surfaces of the n-type and the p-type barrier regions, said surfaces being inclined with respect to the substrate,
    wherein one of the n-type barrier regions and the p-type barrier regions are continuously interconnected through a planar base portion of the same one of the n-type barrier regions and the p-type barrier regions, the planar base portion being located on the substrate, and the other of the n-type barrier regions and the p-type barrier regions comprise a continuous outer layer that continuously coats the inclined surfaces of at least two of the structures, and
    wherein the inclined surfaces form pyramidal shapes.

12. The apparatus of claim 11, wherein each of the inclined surfaces is at an angle of about 55 to 65° with respect to a horizontal plane of the substrate.

13. The apparatus of claim 11, wherein a quantum well is located at said junctions.

14. The apparatus of claim 13, wherein the quantum well has a quantum well layer and barrier regions, the quantum well layer being interposed between the barrier regions.

15. The apparatus of claim 13, wherein the quantum well has a thickness of about 1 to 5 nanometers.

16. The apparatus of claim 11, wherein the one of the n-type barrier regions and the p-type barrier regions comprise pyramid portions on the base portion, and the other of the n-type barrier regions and the p-type barrier regions comprise an outer layer covering the pyramid portions and the base portion.

17. The apparatus of claim 16, wherein the inclined surfaces form hexagonal pyramids.

18. The apparatus of claim 11, wherein each of the crystalline structures is configured to emit light through outer surfaces thereof when a voltage is applied between the n-type and p-type barrier regions, the outer surfaces of the structures being inclined with respect to the substrate.

19. The apparatus of claim 11, further including a first ohmic contact located on the base portion and a second ohmic contact located on the outer layer, wherein the outer layer is substantially not covered by the first ohmic contact or the second ohmic contact.

20. The apparatus of claim 19, wherein the first ohmic contact is configured as a ring that surrounds one of the crystalline structures and the second ohmic contact is configured as a second ring within the one of the crystalline structures.

* * * * *